United States Patent [19]

Krumm

[11] Patent Number: 5,049,971

[45] Date of Patent: Sep. 17, 1991

[54] MONOLITHIC HIGH-FREQUENCY-SIGNAL SWITCH AND POWER LIMITER DEVICE

[75] Inventor: Charles F. Krumm, Thousand Oaks, Calif.

[73] Assignee: Hughes Aircraft Company, Los Angeles, Calif.

[21] Appl. No.: 614,579

[22] Filed: Nov. 15, 1990

Related U.S. Application Data

[63] Continuation of Ser. No. 544,294, Oct. 21, 1983, abandoned.

[51] Int. Cl.[5] .................... H01L 29/06; H01L 27/24; H01L 27/01; H01L 29/10

[52] U.S. Cl. .................................... 357/55; 357/1; 357/3; 357/23.1; 357/23.3

[58] Field of Search ............... 357/23.3, 55, 56, 23.15, 357/67, 23.1, 1, 3

[56] References Cited

U.S. PATENT DOCUMENTS

| | | | |
|---|---|---|---|
| 3,038,085 | 6/1962 | Wallmark et al. | 357/55 |
| 3,813,585 | 5/1974 | Tarui et al. | 357/3 |
| 3,953,879 | 4/1976 | d'Arlach et al. | 357/56 |
| 4,005,467 | 1/1977 | Vergnolle | 357/55 |
| 4,092,660 | 5/1978 | Blocker, III | 357/55 |
| 4,106,044 | 8/1978 | Yoshida et al. | 357/56 |
| 4,190,853 | 2/1980 | Hutson | 357/55 |
| 4,230,313 | 3/1982 | Gloanec et al. | 357/3 |
| 4,300,148 | 11/1981 | Niehaus et al. | 357/90 |
| 4,402,127 | 9/1983 | Pham et al. | 357/3 |

*Primary Examiner*—Andrew J. James
*Assistant Examiner*—Daniel N. Russell
*Attorney, Agent, or Firm*—Paul M. Coble; W. K. Denson-Low

[57] ABSTRACT

A device useful both as a switch and power limiter and particularly adapted for use in microwave application. The device is made with conventional FET processing technology, a current conducting layer being formed at a surface of a substrate, the device then being electrically isolated by using any one of a number of conventional processes. Ohmic contacts are deposited to make electrical contact at the conducting layer. A groove is then cut with a focused ion beam across the conducting layer and between the ohmic contacts. The length of the groove controls the threshold voltage for the device and the depth controls the saturation current. Very low values of saturation current can be obtained by controlling the groove dimensions thus significantly reducing the DC power drain when the device is operated just above saturation. A very high differential resistance ratio is obtained by adjusting the threshold voltage of the device.

3 Claims, 2 Drawing Sheets t 16 ℓ 20 d 18 14 10 12

10
20
16
18
W
2.
2.
14
12
17 t
16
ℓ
20
d
18
14
10
12

I
Ia
Ib
ΔV/ΔI = Roff
Isat
Isat'
ΔV/ΔI = Ron
-Va -Vb
Vb Va
V
-Ib
-Ia

MONOLITHIC HIGH-FREQUENCY-SIGNAL SWITCH AND POWER LIMITER DEVICE

This is a continuation of application Ser. No. 06/544,294, filed Oct. 21, 1983.

BACKGROUND OF THE INVENTION

1. Field of the Invention

The invention relates to a semiconductor switch and limiter device and, in particular, to a GaAs current limiter and switch having a control groove preferably formed with a focused ion beam.

2. Description of the Prior Art

In many high frequency and radio frequency (rf) applications, and in particular, those of microwave frequency, it is often necessary to design circuit systems which have a high degree of signal and power isolation between certain parts thereof. For example, an ordinary radar system must have the capability of both transmitting and receiving microwave signals. The designer is faced with the problem of electrically isolating the transmitter and receiver functions of the system due to the different operating characteristics of each. Typically, a radar transmitter will operate at power levels near 1 kilowatt whereas a radar receiver will quickly saturate at power levels of about one milliwatt. In order to prevent the electrical coupling of transmitter power to the receiver, a switch device is typically designed into the antenna between the transmitter and receiver circuits to prevent the transmission of power thereinbetween.

Switch devices have long been available in the prior art. For example, silicon PIN diodes have been utilized in the microwave application described hereinabove. However, PIN diode switches have high power dissipation when biased in the forward or "on" state and require a large reverse bias (typically 10-30 volts) to drive the switch to the "off" state and prevent current flow. Thus the design of the driver/power supply required to switch the PIN diode between "on" and "off" states is often very complex. Finally, PIN diodes generally have a slow response time. These disadvantages in the use of PIN diodes have caused system designers to look for alternatives.

The design of modern high speed integrated circuits has advanced to the point where many circuit components and functional blocks are provided on extremely small chip areas. Commonly, it has become necessary for designers to minimize the power dissipation of each circuit element formed on the chip. Thus, in those circuit applications wherein a high speed switch is required and wherein monolithic techniques are practical, the PIN diode switches described hereinabove would not be practical due to their relatively large power dissipation.

The cost effectiveness of a microwave circuit would be enhanced if the circuit had the capability of performing more than one function. For example, it would be desirable if the electrical isolating device described above functions as a power limiter, in addition to its switching function, particularly in limiting the amount of power that could be passed, or transmitted as in the radar application described above. Existing PIN diodes cannot function as a passive limiter.

SUMMARY OF THE INVENTION

The present invention provides a dual function device that can be easily incorporated into monolithic, microelectronic circuits and that is particularly adapted for use in microwave applications. The device, which functions both as a switch and a power limiter, is formed with conventional FET processing technology, the current carrying layer being formed on a semi-insulating substrate. Mesas are then formed for electrical isolation purposes, by masking and chemically etching to remove the electrically conductive material surrounding the active device area. Ohmic contacts are then formed to make electrical contact to the conducting layer. A control groove is then cut, preferably with a focused ion beam, with the length of the groove controlling the threshold voltage for the device and the groove depth controlling the device current. The resulting saturating I-V characteristic is indicative of a device that has a very low resistance below saturation and a very high differential resistance above saturation. By controlling the saturation current limit threshold, the device may also act as a power limiter restricting the maximum amplitude of high frequency power that can be transmitted.

The present invention thus advantageously provides a switch and current limiting device that can be fabricated with a focused ion beam on the same chip with other high speed devices thus reducing the overall cost of fabricating a microelectronic device that requires switching and/or limiter capabilities.

Further, a simple technique is advantageously provided for controlling the device threshold voltage and current such that current saturation occurs at relatively low saturation voltages. Thus, a low saturation voltage lowers the DC power drain when the device is operated just above saturation (switch "off" state), an important consideration particularly in microwave applications. Typically, the device is normally biased in the conducting or "on" state so that the bias is required only to turn the device "off".

The device is particularly advantageous when used as a microwave switch since it can offer a potentially high "on" to "off" resistance ratio and thus will function as a reflecting microwave switch with high "off" insertion loss by reflecting the incident power.

The present invention is advantageously adapted to utilizing a technique by which accurate control of the device threshold voltage and magnitude of the saturation current can be obtained. This is accomplished preferably by using focused ion beam technology to cut a narrow groove into the conducting channel area of the device between the two ohmic contact pads. The length of the groove, which is accurately controlled by the focused ion beam, controls the threshold voltage of the device and the depth of the groove, with respect to the total implanted layer depth, controls the saturation current. Saturation voltages can be reduced to very low values by reducing the length of the groove.

Limiting action is advantageously obtained with the device when the instantaneously applied AC potential across the device has a value greater than the threshold voltage. For that portion of time, the differential resistance of the device changes from the low value below threshold to an extremely high value above threshold. Since all but the peak portion of the AC voltage will effectively see only the low differential resistance about the operating point, the device acts as a power and current limiter at a level that is dependent on the DC bias voltage applied to the device.

The threshold voltage and the power handling capability of the device is established by device dimensions and material parameters, and may be selected so as to permit the device of the present invention to be fabricated on the same chip with other high speed GaAs circuits. The low saturation voltage which is achievable by appropriate control of the groove dimensions lowers the DC power drain significantly when the device is operated just above saturation thus making the device ideally suited for integrated circuit applications. The device of the present invention essentially draws no power in "on" state, it should be noted, whereas the prior art PIN diode draws a substantial power in an equivalent state and, further, the diode generally consumes some power even when reversed biased to an "off" state.

BRIEF DESCRIPTION OF THE DRAWINGS

For a better understanding of the invention as well as other advantages and further features thereof, reference is made to the following description which is to be read in conjunction with the accompanying drawings wherein.

DETAILED DESCRIPTION OF THE INVENTION

Figure 1:
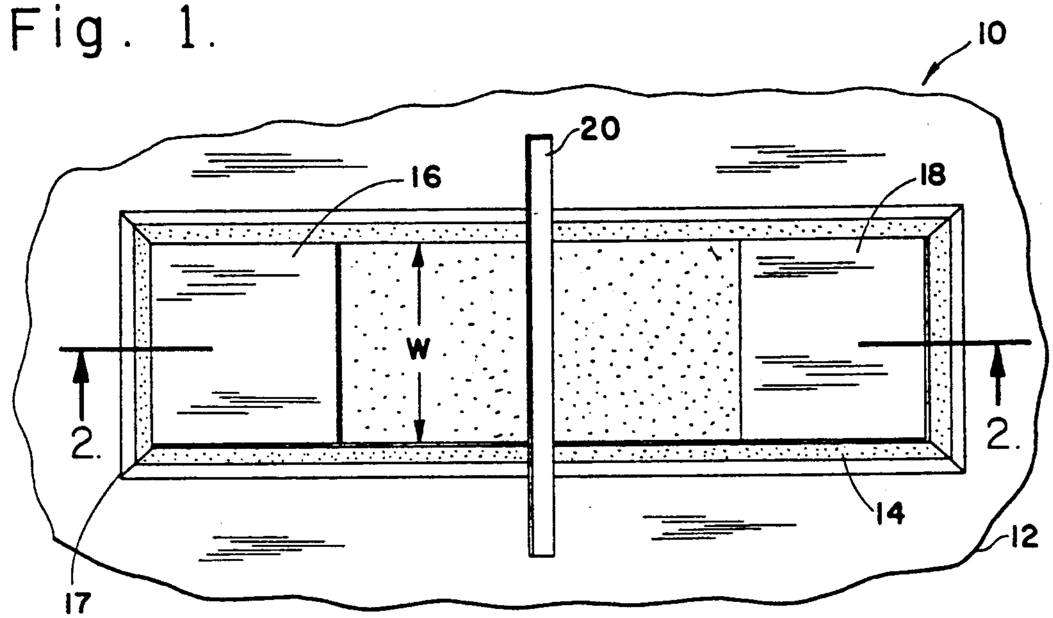
FIG. 1 is a plan view of the switch and limiter device of the present invention.
Figure 2:
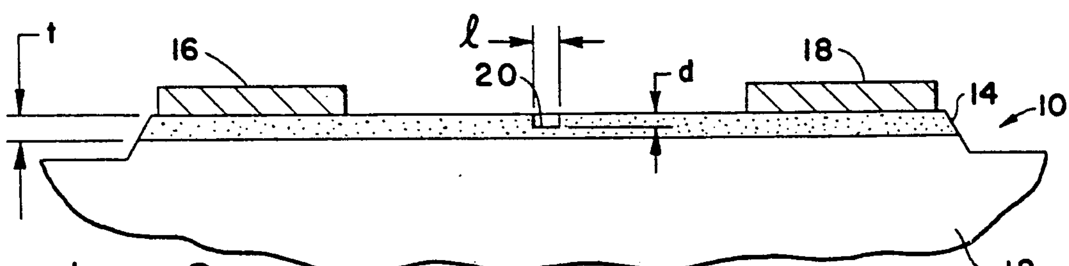
FIG. 2 is a cross-sectional view along line 2—2 of FIG. 1.

Referring now to FIGS. 1 and 2, a plan and cross-sectional vie,, respectively, of the novel switch and limiter device 10 of the present invention is illustrated. Device 10 comprises a substrate 12, such as semi-insulating gallium arsenide (resistivity of about $10^7$ ohm-cm), a conducting layer 14 of thickness t formed by ion implantation or epitaxial techniques at an upper surface of substrate 12 and preferably comprising an n-type dopant material, typically silicon (Si), and ohmic contact pads 16 and 18 which make electrical contact with layer 14. As will be explained in more detail hereinafter, a control groove 20, of length l and depth d is cut between (preferably in the center as illustrated) the two ohmic contact pads 16 and 18. Typically the ohmic contacts are spaced from one another on the order from about 1 $\mu$m to about 5 $\mu$m. The width of the groove 20 extends at least as wide as the width W of the conducting layer or channel 14 and may extend therepast as shown in FIG. 1. Layer 14 is of a semi-conductor conductor material and provides an active region for the conduction of current. Contact 16 and 18 serve as low resistance current conducting electrodes.

For the preferred embodiment of the present invention, the above-described device is fabricated using conventional FET processing technology. Preferably, the substrate or body 12 is of semi-insulating material, such as GaAs. Naturally other materials can be used for substrate 12, including other II–VI materials, such as InP, mixed III–V semiconductor materials such as InGaAs, and compound semiconductor/insulator substrates, such as may be formed utilizing sapphire. The thickness of substrate 12 is preferably in the range from about 175 micrometers to about 325 micrometers. An active layer 14 is formed on the surface of substrate 12 preferably by introducing n-type dopants by ion implantation. The dopant ion preferably comprises Si ions implanted at an energy of approximately 100 KeV to a dosage of approximately $1.0\times10^{13}$ ions/cm$^2$. The thickness of layer 14 is preferably in the range from about 1000 Å to about 3000 Å.

Mesa isolation is preferably used to electrically isolate the device 10 from adjacent circuits. The mesas are formed by masking and chemical etching to remove the conducting material surrounding the active device area (mesa boundary indicated by reference number 17). Ohmic contacts 16 and 18, typically comprising AuGe-Ni-Au, are deposited to make electrical contact to layer 14 in a conventional manner.

Although mesa formation is described as the preferred technique for providing electrical device isolation, other techniques can be equally utilized. For example, ions such as boron, hydrogen or oxygen may be implanted in the surface of the substrate 12 surrounding the conducting layer 14 in a conventional manner. Such an implant serves to disrupt the electrical quality of the implanted substrate to the point current conduction is effectively precluded. Also, vapor-phase epitaxy, molecular-beam epitaxy, and metal organic chemical vapor deposition techniques may be utilized to initially provide an appropriate conductive layer 14 on the surface of a substrate 12. The epitaxial deposition processes enable device 10 to be fabricated in planar monolithic form and thus ultimately may be part of the preferred method of fabricating the present invention.

In accordance with the teachings of the present invention, a groove 20 is cut into layer 14 preferably with a focused ion beam. Focused ion beam micromachining is a conventional process and the details thereof thus will not be set forth herein. Suffice to say that a stream of ions is reduced to an extremely narrow beam and accurately focused by electromagnetic means. It should be noted that for groove lengths l in the range of about 500 Å to about 3000 Å, focused ion beam micromachining is necessary for forming the groove. Above 3000 Å, other techniques may also be utilized, such as electron beam lithography and etching. In accordance with the teachings of the present invention, a focused ion beam is utilized to sputter groove 20 in the regions between ohmic contacts 16 and 18 as shown. Typical groove lengths range from about 500 Å to about 5 $\mu$m and groove depths range from about 500 Å to about 4000 Å. The width of the groove 20 is not critical but should be at least equal to the width W of the channel layer 14 as shown in FIG. 1 (typically in the range of 50 $\mu$m to about 2000 $\mu$m). A 60 KeV focused $Ga^+$ (gallium ion) beam has been successfully utilized to form the groove 20. By varying the beam dwell time, grooves of different depths can be fabricated and the corresponding I–V characteristics of the device established.

It has been determined that for best device performance, the depth of the groove 20 should have an aspect ratio (ratio of the length of the groove 20 to the depth of the channel) less than or equal to one to permit optimum device fabrication. This is due to the fact that at a certain depth the ion beam micromachining will generate material which would splatter on the sidewalls of the groove without being removed, thus decreasing the effectiveness of the process.

As set forth hereinabove, the device saturation voltage decreases generally linearly with a decrease in groove length, the saturation current, $I_s$, decreasing as the groove depth increases. For small values of the residual resistance associated with the ohmic contacts, the saturation voltage $V_s$ is proportional to $l \cdot E_s$, where $E_s$ is the saturation field. For $E_s = 3$ Kv/cm (typical of GaAs material), a groove length of 3000 Å, a channel layer thickness of 2000 Å, and a groove depth of 500 Å, a saturation voltage of approximately 1.4 V was obtained. For longer channel lengths, the saturation voltages were proportionally larger.

Figure 3:
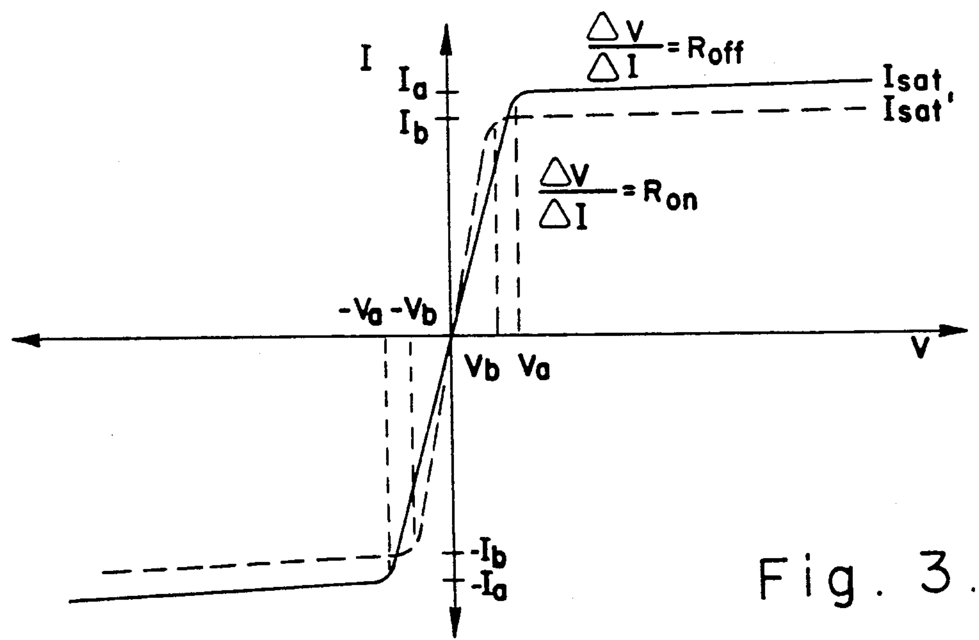
FIG. 3 is a typical I-V characteristic for the device shown in FIG. 1 and 2.

FIG. 3 illustrates typically I–V characteristics for device 10. The characteristic shown in solid has a saturation, or threshold voltage, $V_a$ and a corresponding saturation current $I_a$. The differential resistance for the "on" portion of the characteristic is represented by $R_{on}$, typically in the range from about 1 to about 5 ohms, and the differential resistance for the "off" portion of the characteristic is represented by $R_{off}$, a value in the hundreds of ohms. The threshold voltage $|V_a|$ is approximately 2 volts or less DC, $|V_a|$ and $|I_a|$ being established by the dimensions l, t, w, and d.

More completely, the threshold voltage $|V_a|$ is substantially dependent on the current saturation threshold $|I_a|$ that exists for the conducting layer 14. The current threshold is, in turn, dependent on the saturated electron drift velocity with electric field for the particular semiconductor material, dopant species and dopant concentration of the conducting layer 14. The portion of the conducting layer generally under the groove 20 will experience an electric field greater than that of the surrounding portion of the layer 14 for a given voltage potential applied across the device 10. Consequently, the dimensions of the portion of the layer 14 generally underlying the groove 20 and entire conducting layer 14 are critical in establishing the voltage and current threshold.

In the operation, a DC voltage bias potential is appropriately coupled to the device 10 so as to be applied between the contacts 14, 16. An AC signal, typically of rf or microwave frequencies is also appropriately coupled to the device 10 so as to pass therethrough if at all. Naturally, the coupling of the DC bias potential and the AC signal should be such to prevent unnecessary interaction thereinbetween. Typically, this can easily be accomplished by providing coupling capacitors and inductors.

Referring again to FIG. 3, the device 10 essentially acts as an "on" or conducting switch when the absolute value of the DC bias potential is close to zero. The AC signal passes therethrough experiencing only the low $R_{on}$ differential resistance of the device 10. Conversely, when the absolute value of the DC bias potential is sufficiently above $|V_a|$, the AC signal experiences the very high $R_{off}$ differential resistance of the device 10. Since current conduction is severly attenuated as a result, the device 10 is considered to be acting as an "off" or nonconducting switch.

The power limiting function of the device 10 arises from its capability of limiting current to within a certain magnitude. For AC signals having a peak voltage in excess of $|V_a|$ and a DC bias potential of zero, the device 10 limits current conduction at a nearly constant level for that portion of time that the instantaneous voltage of the AC signal exceeds $|V_a|$. Consequently, the instantaneous power transferred through the device 10 is correspondingly limited.

It should be understood that by appropriately increasing the absolute value of the DC bias potential, the power limiting function of the device 10 may be utilized to selectively pass only a portion of the AC equal to $-V_a$, then substantially only the positive portion of the AC signal will be passed. That is, only that portion of the AC signal where the instantaneous magnitude of the AC signal and the DC bias potential is between $-V_a$ and $V_a$.

It should also be understood and apparent from the foregoing that device 10 is bilateral both with respect to the direction of AC signal propagation and DC bias current flow. A second I–V characteristic is shown in phantom in FIG. 3 and illustrates how reducing channel length and channel depth will reduce the saturation voltage ($|V_b|$) and the saturation current ($|I_b|$), respectively, further reducing the maximum power that is capable of being passed by device 10.

Figure 4:
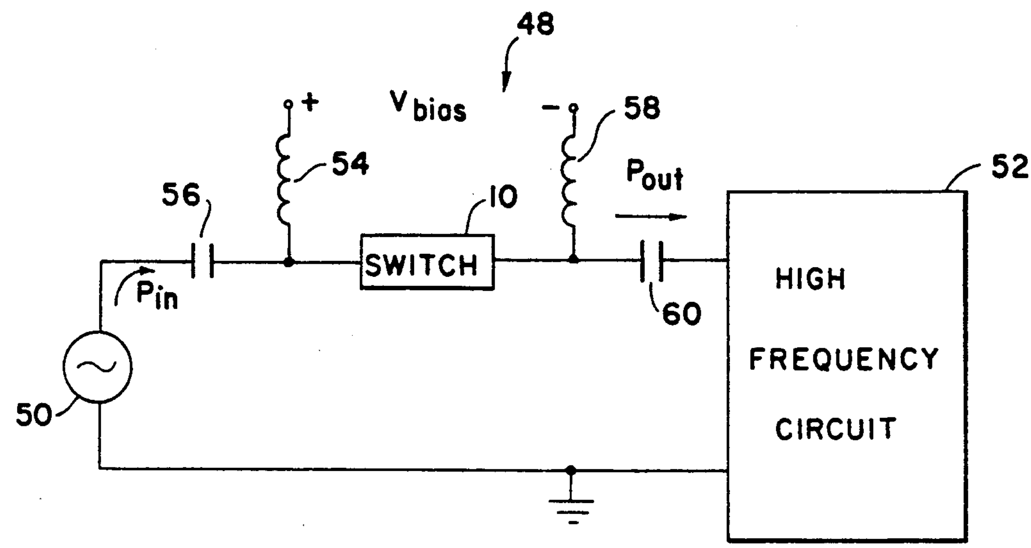
FIG. 4 illustrates the application of the device of the present invention in a microwave circuit.

FIG. 4 illustrates the use of the device 10 of the present invention in a typical system 48. In this application, the device 10 is utilized to selectively connect a signal source 50 to a high-frequency circuit 52 and to limit the input power ($P_{in}$ in the illustration). In other words, it is desired to limit $P_{out}$ to within a given range and, further, selectively switch it to zero.

A DC bias potential $V_{bias}$ is coupled to switch 10 through inductor 54 and functions to switch device 10 from "on" to "off" depending on its magnitude as set forth hereinabove. Capacitor 56 blocks the DC bias potential from reaching the signal source 50, while capacitor 60 acts to block any DC voltage which otherwise would be transmitted to the circuit 52. The inductors 54, 58 provide a DC current path to and from the switch 10 while blocking and, thereby, preventing interference with the AC signal (as set forth hereinabove switch 10 is bilateral in that power could be applied to either of the ohmic contacts 16, 18 shown in FIGS. 1 and 2).

With $V_{bias}$ equal to zero, switch device 10 is "on" and the input AC signal, appropriately limited, is passed to the circuit 52. With $V_{bias}$ greater than the threshold voltage (typically 2 volts), switch 10 is "off". In this embodiment, approximately 10 db of AC signal isolation can be obtained at microwave frequencies.

Figure 5:
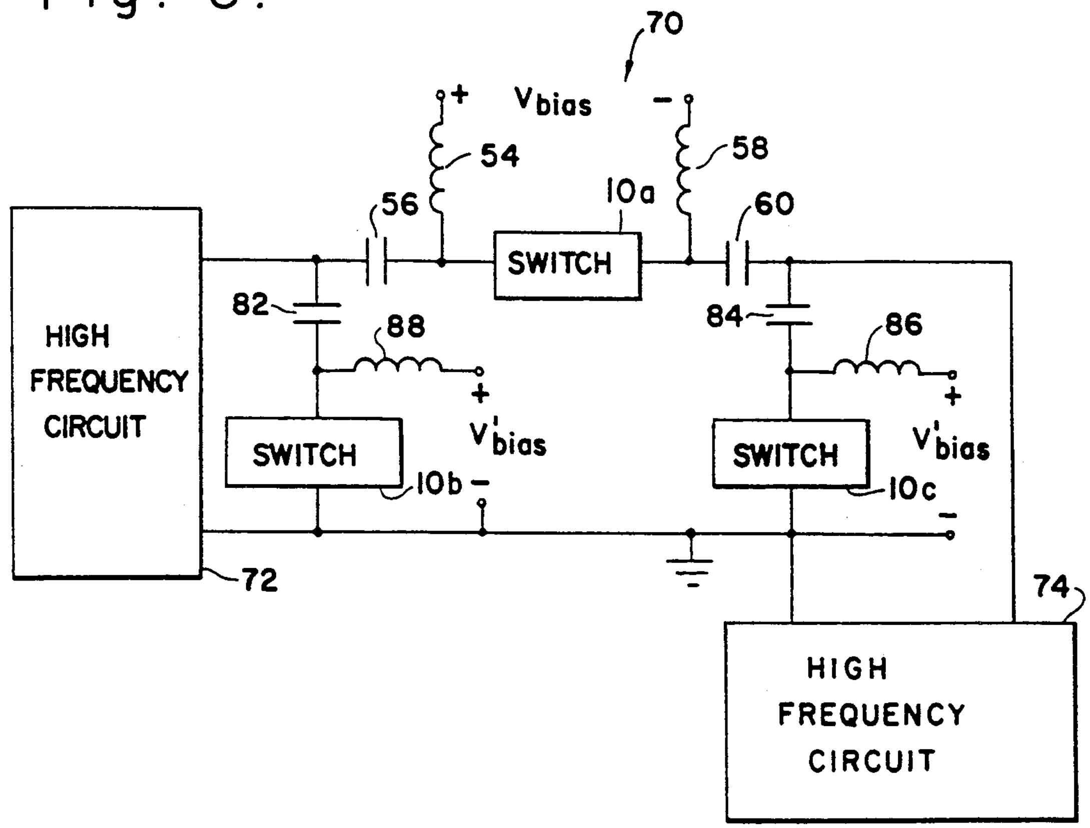
FIG. 5 illustrates another microwave application of the present invention.

FIG. 5 shows circuit 70 having an arrangement of switches to provide a greater degree of signal isolation. In the circuit 70 as illustrated, three devices 10 are utilized. Capacitors 56, 60, 78, 80 are provided for AC signal coupling and DC voltage blocking while the inductors 54, 58, 86, 88 provide an AC signal blocked DC current path for each of the DC bias potentials. In order to distinguish between the DC bias potential, $V_{bias}$, applied to the series switch device 10*a* and the two parallel arranged switch device 10*b,c* the DC bias potential provided for the latter switches is labeled $V'_{bias}$. In this arrangement, the switch devices 10*b,c* can be in the "off" state and switch device 10*a* in the "on" state, permitting an AC signal to be passed between the high frequency circuits 72, 74 with $V_{bias}=0$ and $V'_{bias}$ greater than the device 10*b,c* threshold voltage. Signal isolation between the circuits 72, 74 can be obtained by placing the series switch device 10*a* in the "off" state and the parallel switch devices 10*b,c* in the "on" state by providing $V_{bias}$ greater than the threshold voltage and $V'_{bias}$ approximately equal to zero. The arrangement shown in FIG. 5 can be used to obtain approximately 30 db of AC signal isolation at high microwave frequencies. Naturally, other switch arrangements can be designed based on the above teaching and to provide varying degrees of AC signal isolation with the particular design of the device 10 establishing the power limiting action desired.

The present invention thus provides a semiconductor device which has the capability of functioning as a switch and passive limiter.

The device is fabricated by utilizing conventional FET processing techniques and a control groove is preferably cut into the device conducting layer with a focused ion beam. By appropriate control of the ion beam, a groove of desired length and depth can be formed which in turn is determinative of the saturation voltage and saturation current, respectively. Thus, an accurate technique for controlling and adjusting these parameters, in addition to the normal control provided by device material selection, is provided. The use of the control groove allows very low saturation voltages to be obtained which in turn lowers the DC power drain when the device is operated above saturation.

The device described hereinabove can be fabricated with a focused ion beam monolithically with other high speed devices to provide an integrated circuit which includes switching and current (power) limiting capabilities.

The ease of device fabrication, the low power dissipation associated with the device and the relative ease in controlling voltage and current saturation make the device of the present invention ideally suited for high-frequency, rf, and microwave applications, particularly in applications analogous to preventing the power from an antenna transmitter from saturating the antenna receiver.

While the invention has been described with reference to its preferred embodiment, it will be understood by those skilled in the art that various changes may be made and equivalents may be substituted for elements thereof without departing from the true nature and scope of the invention. In addition, many modifications may be made to adapt a particular situation or material to the teachings of the invention without departing from its essential teachings.

What is claimed is:

1. A switch and power limiter device comprising:

a) a semi-insulating substrate;

b) a semiconductor layer formed at a surface of said substrate, said layer having a groove therein extending across the width of said layer, said groove having a depth less than the thickness of said layer and having a length less than approximately 3000 Å; and c) first and second contacts provided to said semiconductor layer on opposite sides of said groove, respectively.

2. The device of claim 1 wherein the length of said groove is greater than the depth of said groove.

3. The device of claim 1 wherein the spacing between said first and second contacts is in the range from about 1 μm to about 5 μm and the thickness of said semiconductor layer is in the range from about 1000 Å to about 3000 Å.

* * * * *